Jan. 24, 1967 D. R. VON RECKLINGHAUSEN 3,299,946
MOUNTING AND HEAT SINK DEVICE FOR ELECTRICAL COMPONENTS
Filed June 4, 1965
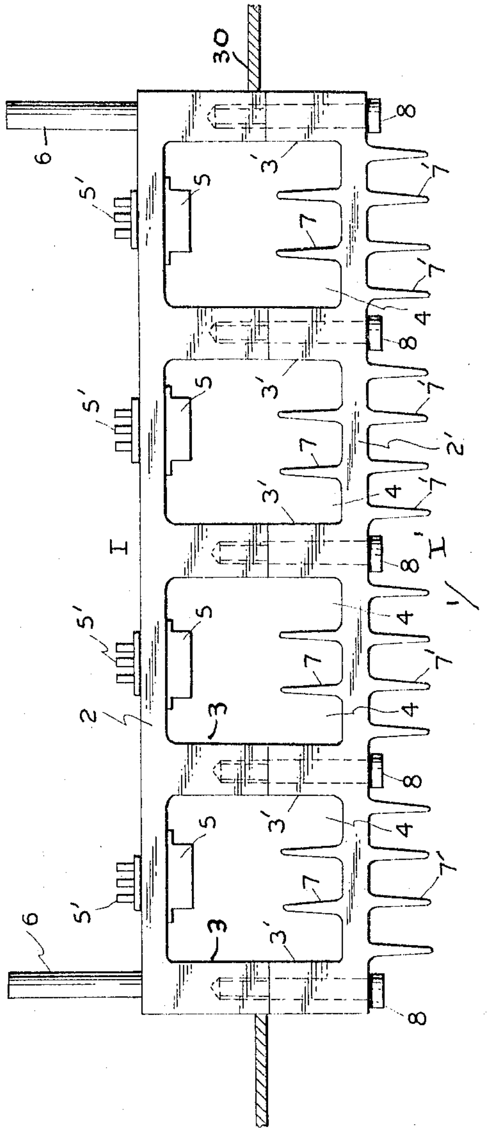
INVENTOR
DANIEL R. VonRECKLINGHAUSEN
BY Rines and Rines
ATTORNEYS United States Patent Office 3,299,946
Patented Jan. 24, 1967

3,299,946
MOUNTING AND HEAT SINK DEVICE FOR ELECTRICAL COMPONENTS

Daniel R. von Recklinghausen, Arlington, Mass., assignor to H. H. Scott, Inc., Maynard, Mass., a corporation of Massachusetts Filed June 4, 1965, Ser. No. 461,429
3 Claims. (Cl. 165—80)

The present invention relates to heat sink apparatus and, more particularly, to heat sinks adapted for mounting and dispersing heat from solid-state relays, such as semi-conductor devices, transistors, silicon-controlled rectifiers and the like, and other electrical or related components.

One of the problems with conventional types of finned heat sinks used in connection with electrical and electronic equipment resides in the otherwise usable space within the confines of the chassis that is consumed by the heat sink structure itself and the necessity for sufficent air circulation within the chassis region to enable effective heat-dissipating operation of the heat sinks. In addition, for purposes of conserving chassis space, consistent with exposure of the heat sink fins, the heat sinks must sometimes be mounted in such position that the transistors or other components carried thereby are inaccessible or reachable only with great difficulty and awkwardness for replacement or adjustment. These inherent limitations in the use of current heat sinks have, in some cases, necessitated the use of larger chassis and of fans and other air-circulating means.

An object of the present invention, accordingly, is to provide a new and improved heat sink apparatus that shall not be subject to such limitations and disadvantages, but that, in summary, through a construction that permits the finned portions of the heat sink to be detachably mounted external to the chassis, enables conservation of chassis space, ready accessibility to the electrical components, and improved external air circulation.

A further object is to provide a novel heat sink apparatus of more general usefulness, also.

Other and further objects will be described hereinafter and will be more particularly delineated in connection with the appended claims.

The invention will now be described with reference to the accompanying drawing, the single figure of which is a top elevational view of a preferred embodiment.

The heat sink 1 of the present invention is illustrated as comprising a section of the outside wall 30 of a chassis or the like into which it has been inserted or mounted (as by bottom screws or other attaching means, not shown), having a first portion I disposed within the chassis space and a second portion I′ external thereto. The portions I and I′ comprise respective substantially planar heat-dissipative metal sheets 2 and 2′ provided with corresponding pluralities of mating heat-dissipative projections 3, 3′ extending toward one another from the inside walls or internal sides of the respective sheets at spaced locations therealong, thus to define a plurality of juxtaposed open cells 4.

The semi-conductor devices or other heat sources 5 are mounted on the inside wall or internal side of the sheet 2, with electrical terminals 5′ for establishing connections extending on the opposite or outside wall of the sheet 2. Mounting posts 6 may also be provided on such outside wall for attaching printed circuit boards or other components to be electrically connected to or assembled with the structure.

By means of screws 8, portion I′ may be detachably secured to the portion I, with the projections 3–3′ in mating heat-conductive relationship, to close off the cells 4 and thus cover the devices 5. Heat-dissipating fins 7 and 7′ extending substantially orthogonally from opposite sides of the sheet 2′ toward the devices 5 and away from the structure I–I′ provide for heat dissipation within the cells 4 and external to the assembly I–I′, with air free to circulate between the fins, external to the chassis 30. A lid (not shown) may also be placed on top of the chassis, with its edge ending along the line of the chassis wall 30 and with the fin region 7–2′–7′ left open for external air circulation. The degree of insertion of the electrical-component-carrying portion I within the chassis volume and the degree of protrusion of the radiating structure I′ external to the chassis may obviously readily be adjusted for different space considerations, as desired.

As shown, the projections 3–3′ are preferably of substantially equal length such that their junctions lie in a longitudinal plane substantially symmetrically bisecting the substantially rectangular cells 4. The projections 3, indeed, are designed in number and size to provide sufficient heat-dissipation for the testing or trouble-shooting operation of the devices 5 with the portion I′ detached to permit ready external access thereto; the structure I′ providing the additional heat-dissipation required in long-term use. In actual structures of this type, indeed, about 6¾ inches long and about 2³⁄₁₆ inches between the outer tips of fins 7′ (about ⅜ inch long) and the outer surface of sheet 2, and with four cells 4 as shown, highly advantageous 1.2° C./watt heat capacity with temperature rise has been attained.

It is, of course, not necessary that four cells be used or that the fins be provided in the numbers or orientations shown. Further modifications will also occur to those skilled in the art and all such are considered to fall within the spirit and scope of the invention as defined in the appended claims.

What is claimed is:

1. Heat sink apparatus having, in combination, a first substantially planar heat-dissipative sheet provided with a plurality of heat-dissipative projections extending substantially orthogonally from one side of the sheet at spaced locations therealong to define a plurality of juxtaposed open cells, means for mounting heat sources such as semi-conductor means and the like on the said one side of the sheet within each cell, electrical terminal means disposed on the opposite side of the sheet from the semi-conductor mounting means and the like for establishing electrical connections therewith, a second heat-dissipative sheet provided with a second similar plurality of substantially orthogonally extending heat-dissipative projections for mating with the projections from the first sheet, means for detachably securing in heat-conductive contact the projections of the sheets in such mating relationship to close off the cells and thus cover the semi-conductor mounting means and the like, the second sheet having a plurality of heat-radiating fins extending therefrom to effect further dissipation of heat generated within the cells and external thereto, and means for enabling the securing of the apparatus to an outside wall of a chassis and the like to permit the mounting of a semi-conductor means and associated electrical terminals and connections within a chassis and the like while exposing the said fins to air circulation external to a chassis and the like and enabling external access to said semi-conductor mounting means and the like upon detachment of the said second sheet.

2. Apparatus as claimed in claim 1 and in which the lengths of the projections of each sheet are substantially the same, providing a substantially rectangular closed cell cross section symmetrical with respect to the line formed by the mating of the said projections.

3. Apparatus as claimed in claim 1 and in which the said fins extend from opposite sides of the said second sheet both within the cells towards the semi-conductor means and external to the cells.

References Cited by the Examiner

UNITED STATES PATENTS

| | | | |
|---|---|---|---|
| 2,965,819 | 12/1960 | Rosenbaum | 317—234 |
| 3,013,186 | 12/1961 | Jones | 317—100 |
| 3,081,824 | 3/1963 | Macall | 165—185 X |
| 3,206,646 | 9/1965 | Relation et al. | 317—100 |
| 3,249,817 | 5/1966 | Sinclair et al. | 317—100 |

MEYER PERLIN, *Primary Examiner.*

A. W. DAVIS, *Assistant Examiner.*